United States Patent [19]
Shimizu

[11] Patent Number: 6,043,699
[45] Date of Patent: Mar. 28, 2000

[54] LEVEL SHIFT CIRCUIT

[75] Inventor: Yasuhide Shimizu, Nagasaki, Japan

[73] Assignee: Sony Corporation, Japan

[21] Appl. No.: 09/184,975

[22] Filed: Nov. 3, 1998

[30]     Foreign Application Priority Data

Nov. 4, 1997   [JP]   Japan ................................. 9-301889

[51] Int. Cl.$^7$ ...................................................... H03L 5/00
[52] U.S. Cl. ........................... 327/333; 327/437; 327/55;
326/80; 326/81
[58] Field of Search ................................... 327/333, 374,
327/382, 427, 437, 391, 108, 198, 55, 228;
326/21, 22, 23, 63, 64, 80, 81

[56]              References Cited

U.S. PATENT DOCUMENTS

| | | | |
|---|---|---|---|
| 5,473,268 | 12/1995 | Declercq et al. | 326/81 |
| 5,698,993 | 12/1997 | Chow | 326/81 |
| 5,723,986 | 3/1998 | Nakashiro et al. | 326/81 |
| 5,781,026 | 7/1998 | Chow | 326/26 |
| 5,892,382 | 4/1982 | Ueda et al. | 327/202 |

*Primary Examiner*—Timothy P. Callahan
*Assistant Examiner*—An T. Luu
*Attorney, Agent, or Firm*—Rader, Fishman & Grauer; Ronald P. Kananen

[57]              ABSTRACT

A level shift circuit reduced in a circuit area and conversion delay when converting a signal level, capable of operating at a high speed, expanded in the range of the operatable voltage, and capable of operating at a low voltage, including a first transistor connected between a voltage Va source and an output terminal, a second transistor connected between a voltage Vc source and an output terminal, a third transistor connected between a voltage Vc source and a gate of the second transistor, a fourth transistor connected between a voltage Va source and the gate of the second transistor, a fifth transistor connected between the ground and the output terminal, and a sixth transistor connected between the ground and the gate of the second transistor, wherein a connection point of an output terminal and the first, second, and fifth transistors is connected to a gate of the third transistor, gates of the fourth and fifth transistors are connected to an input terminal, and an inverted signal of an input signal to the input terminal is supplied to gates of the first and sixth transistors.

23 Claims, 7 Drawing Sheets

LEVEL SHIFT CIRCUIT

BACKGROUND OF THE INVENTION

1. Field of the Invention

The present invention relates to a level shift circuit, and more particularly relates to a level shift circuit functioning as an interface between circuits operating at different power source voltages.

2. Description of the Related Art

Conventionally, when connecting logic circuits having different power source voltages, it is necessary to shift the logic level of an output signal from one logic circuit to the level of the other logic circuit receiving the output signal.

A level shift circuit is a circuit used for such a purpose. Typical examples will be shown below.

FIG. 6 is a circuit diagram of an example of a level shift circuit of the related art.

In FIG. 6, the level shift circuit comprises an inverter I1 which operates by a power source voltage (3V) of a circuit of the input side and four transistors PT1, PT2, NT1, and NT2 which operate by a power source voltage (6V) of a circuit of the output side. The transistors PT1 and T2 are comprised of p-channel MOS (PMOS) transistors, and the transistors NT1 and NT2 are comprised of n-channel MOS (NMOS) transistors.

An input terminal TIN is connected to a gate of the transistor NT1 and the input of an inverter I1, while an output of the inverter I1 is connected to a gate of the transistor NT2. A source of the transistor NT1 is grounded, while the drain is connected to an output terminal TOUT, a drain of the transistor PT1, and a gate of the transistor PT2.

A source of the transistor NT2 is grounded, while the drain is connected to a drain of the transistor PT2 and a gate of the transistor PT1.

Note that, in this example, the logic level of the input signal SIN is 3V at a high (H) level and is 0V at a low level (0V), while the logic level of the output signal SOUT is 6V at a high (H) level and 0V at a low (L) level.

In such a configuration, when the logic level of the input signal SIN is H, the transistor NT1 turns on. Accordingly, the potential at the gate of the transistor NT2 falls, so the potential at the drain of the transistor PT2 rises.

At this time, because the potential at the gate falls, the transistor PT1 functions to lower the potential of the output terminal TOUT more reliably, while an L level signal is output at the output terminal TOUT.

Also, since the input potential of the inverter I1 is high, the output of the inverter I1 becomes 0V and the transistor NT2 is in an off-state.

Conversely, when the logic level of the input signal SIN becomes L, the transistor NT1 turns off and the inverter I1 inverts the level and makes the output potential 3V. As a result, the transistor NT2 turns on and lowers the potential at the gate of the transistor PT1. Due to this, the potential at the drain of the transistor PT1 rises and the H level signal SOUT is output at the output terminal TOUT.

At this time, since the potential at the gate rises, the transistor NT2 functions to lower the potential at the drain (potential at gate of transistor PT1) more reliably.

In this way, the level shift circuit converts the input signal SIN from the logic circuit of a power source voltage of 3V to the output signal SOUT having a high logic level of 6V.

FIG. 7 is a circuit diagram of another example of a level shift circuit of the related art.

The level shift circuit in FIG. 7 comprises an inverter I1 which operates by a power source voltage (3V) of the input side of the circuit and six transistors PT1, PT2, PT3, PT4, NT1, and NT2 which operates by a power source voltage (6V) of the output side of a circuit.

In the level shift circuit in FIG. 7, in addition to the configuration of the level shift circuit of FIG. 6, the transistor PT3 comprised by a PMOS transistor is connected in series between the source of the transistor PT1 and the supply line of the power source voltage of 6V, while the transistor PT4 comprised by a PMOS transistor is connected in series between the source of the transistor PT2 and the supply line of the power source voltage of 6V.

A gate of the transistor PT3 is connected to the input terminal TIN, while a gate of the transistor PT4 is connected to the output of the inverter I1.

In such a configuration, when the logic level of the input signal SIN is H, the potential at the gate of the transistor PT3 rises and the transistor NT1 turns on. Therefore, the potential at the gate of the transistor PT2 falls and the potential at the drain of the transistor PT2 (common connection point of transistor PT2 and transistor NT2) rises.

At this time, since the potential at the gate rises, the transistor PT1 functions to lower the potential of the output terminal TOUT more reliably, and an L level signal SOUT is output at the output terminal TOUT.

Also, since the input potential of the inverter I1 is high, the output of the inverter I1 becomes 0V, the transistor NT is in an off-state, and the transistor PT4 is in an on-state.

Conversely, when the logic level of the input signal SIN becomes L, the potential at the gate of the transistor PT3 falls, the transistor NT1 turns off, and the inverter I2 inverts the level to make the output potential 3V. As a result, the potential at the gate of the transistor PT4 rises and the transistor NT2 turns on, thus the potential at the gate of the transistor PT1 falls.

Due to this, the potential at the drain of the transistor PT1 rises, and an H level signal SOUT is output at the output terminal TOUT.

At this time, since the potential at the gate rises, the transistor PT2 functions to lower the potential at the gate of the transistor PT1 more reliably.

In the level shift circuit, not only the transistors NT1 and NT2 but also the transistors PT3 and PT4 are directly driven by the input signal SIN. Therefore, by adjusting the sizes of the transistors with respect to the operating voltages, it is possible to improve the delay of the input signal which arises at the time of converting a level by the level shift circuit.

As explained above, the level shift circuit is capable of converting the input signal SIN from the logic circuit with the power source of 3V to the output signal SOUT having the H logic level of 6V.

In the level shift circuit in FIG. 6, however, the only transistors directly driven by the input signal are the transistors NT1 and NT2, therefore the operation performance of the level shift circuit is low.

For this reason, at the time of converting the level of the input signal, a large delay arises in the converted signal, which has a detrimental effect on the output side circuit. Alternatively, in the case where the difference of the power source voltages is large between the power source circuits respectively having different power source, it becomes unoperatable.

Namely, the level shift circuit shown in FIG. 6 cannot be used for an interface between high speed logic circuits which operate at different power source voltages. Further, the operatable voltage range is narrow.

On the other hand, in the level shift circuit in FIG. 7, not only the transistors NT1 and NT2 but also the transistors PT3 and PT4 are directly driven by the input signal, therefore it is possible to reduce the delay of the input signal which arises when this level shift circuit converts a level by adjusting the sizes of these transistors with respect to the operating voltages.

Due to this, it is possible to use the level shift circuit for an interface between high speed logic circuits operating at different power source voltages. The range of operating voltage is wide as well.

However, there are disadvantages that the number of transistors is increased compared with the circuit shown in FIG. 6 and, moreover, the size of the device itself cannot be reduced due to the properties of the circuit.

For example, in a circuit such as a decoder which requires several level shift circuits in one circuit, the area occupied by the level shift circuits becomes very large.

Also, since this circuit is comprised of three series-connected transistors, the performance of the circuit declines along with the reduction of the operating voltage and the delay at the conversion of an input signal sometimes becomes further larger than that of the level shift circuit shown in FIG. 6 when operating at a low voltage.

Namely, since the level shift circuit shown in FIG. 7 is comprised of series-connected PMOS transistors, it is not suitable for operating at a low voltage and cannot be expected to operate at a high speed at a wide range of power source voltages.

SUMMARY OF THE INVENTION

An object of the present invention is to provide a level shift circuit which realizes a reduced circuit area, a smaller delay at the time of converting a signal level than the level shift circuits of the related art, a higher speed operation, and a wider range of the operating voltages, including a low voltage.

According to a first aspect of the present invention, there is provided a level shift circuit comprising an input terminal connected to an output of an input side circuit operating by a first power source voltage and a second power source voltage; an output terminal connected to an output side circuit operating by a third power source voltage and a fourth power source voltage which are different from the voltage of the input side circuit; a first node; a second node; a first transistor of a first conductivity type channel connected between a voltage source of the first power source voltage and the first node; a second transistor of a second conductivity type channel connected between a voltage source of the third power source voltage and the first node; a third transistor of the second conductivity type channel connected between the voltage source of the third power source voltage and the second node; a fourth transistor of the first conductivity type channel connected between the voltage source of the first power source voltage and the second node; a fifth transistor of the first conductivity type channel connected between one of the voltage sources of the second power source voltage and the fourth power source voltage and the first node; and a sixth transistor of the first conductivity type channel connected between one of the voltage sources of the second power source voltage and the fourth power source voltage and the second node; and wherein the first node is connected to a gate of the third transistor, the second node is connected to a gate of the second transistor, and gates of the fourth and fifth transistors are connected to the input terminal; an inverted signal of an input signal input to the input terminal is supplied to gates of the first and sixth transistors; and one of the first node and the second node is connected to the output terminal.

The first conductivity type channel may be an n-channel and the second conductivity type channel a p-channel or the first conductivity type channel may be a p-channel and the second conductivity type channel an n-channel.

Preferably, the third power source voltage is higher than the first power source voltage, and the second and fourth voltages are a ground voltage.

Preferably, one of the terminals of each the fifth and sixth transistors is connected to the voltage source of the fourth power source voltage, and the third power source voltage is higher than the first power source voltage.

According to a second aspect of the present invention, there is provided a level shift circuit comprising an input terminal connected to an output of an input side circuit operating by a first power source voltage and a second power source voltage; an output terminal connected to an output side circuit operating by a third power source voltage and a fourth power source voltage which are different from the voltage of the input side circuit; a first node; a second node; a first transistor of a first conductivity type channel connected between a voltage source of the fourth power source voltage and the first node; a second transistor of a second conductivity type channel connected between a voltage source of the second power source voltage and the first node; a third transistor of the first conductivity type channel connected between the voltage source of the fourth power source voltage and the second node; a fourth transistor of the second conductivity type channel connected between the voltage source of the second power source voltage and the second node; a fifth transistor of the second conductivity type channel connected between the voltage source of the third power source voltage and the first node: and a sixth transistor of the second conductivity type channel connected between the voltage source of the third power source voltage and the second node; and wherein the first node is connected to a gate of the third transistor, the second node is connected to a gate of the first transistor, and gates of the fourth and fifth transistors are connected to the input terminal; an inverted signal of an input signal input to the input terminal is supplied to gates of the second and sixth transistors; and one of the first node and the second node is connected to the output terminal.

The first conductivity type channel may be an n-channel and the second conductivity type channel a p-channel or the first conductivity type channel may be a p-channel and the second conductivity type channel an n-channel.

Preferably, the fourth power source voltage is less than the second power source voltage.

According to a third aspect of the present invention, there is provided a level shift circuit comprising a circuit input terminal connected to an output of an input side circuit operating by a first power source voltage and a second power source voltage; a circuit output terminal connected to an output side circuit operating by a third power source voltage and a fourth power source voltage which are different from the voltage of the input side circuit; a plurality of level shift stages, each having a non-inverted output terminal, an inverted output terminal, a first transistor of a first conductivity type channel connected between a voltage source of the first power source voltage and the non-inverted output terminal, a second transistor of a second conductivity type channel connected between a voltage source of the third power source voltage and the non-inverted output terminal, a third transistor of the second conductivity type channel connected between the voltage source of the third power source voltage and the inverted output terminal, a fourth transistor of the first conductivity type channel connected between the voltage source of the first power source voltage and the inverted output terminal, a fifth transistor of the first conductivity type channel connected between one of the voltage sources of the second power source voltage and the fourth power source voltage and the non-inverted output terminal, and a sixth transistor of the first conductivity type channel connected between one of the voltage sources of the second power source voltage and the fourth power source voltage and the inverted output terminal, wherein a common connection point of the non-inverted output terminal; the first, second, and fifth transistors is connected to a gate of the third transistor and a common connection point of the inverted output terminal; the third, fourth, and sixth transistors is connected to a gate of the second transistor; and wherein the non-inverted output terminal of a previous stage is connected to gates of the fourth and fifth transistors of a later stage, the inverted output terminal of the previous stage is connected to gates of the first and sixth transistors of the later stage; gates of the fourth and fifth transistors of an initial stage is connected to the circuit input terminal; an inverted signal of an input signal input to the circuit input terminal is supplied to gates of the first and sixth transistors; and one of the non-inverted output terminal and the inverted output terminal is connected to the circuit output terminal.

Preferably, the first conductivity type channel may be an n-channel and the second conductivity type channel a p-channel.

Preferably, the third power source voltage is higher than the first power source voltage.

Preferably, one each of the terminals of the fifth and sixth transistors is respectively connected to the voltage source of the fourth power source voltage, and the third power source voltage is higher than the first power source voltage.

According to a fourth aspect of the present invention, there is provided a level shift circuit comprising a circuit input terminal connected to an output of an input side circuit operating by a first power source voltage and a second power source voltage; a circuit output terminal connected to an output side circuit operating by a third power source voltage and a fourth power source voltage which are different from the voltage of the input side circuit; a plurality of level shift stages, each having a non-inverted output terminal, an inverted output terminal, a first transistor of a first conductivity type channel connected between a voltage source of the fourth power source voltage and the non-inverted output terminal, a second transistor of a second conductivity type channel connected between a voltage source of the second power source voltage and the non-inverted output terminal, a third transistor of the first conductivity type channel connected between the voltage source of the fourth power source voltage and the inverted output terminal, a fourth transistor of the second conductivity type channel connected between the voltage source of the second power source voltage and the inverted output terminal, a fifth transistor of the second conductivity type channel connected between the voltage source of the third power source voltage and the non-inverted output terminal, and a sixth transistor of the second conductivity type channel connected between the voltage source of the third power source voltage and the inverted output terminal, and wherein a common connection point of the non-inverted output terminal and the first, second, and fifth transistors is connected to a gate of the third transistor and a common connection point of the inverted output terminal, and the third, fourth, and sixth transistors is connected to a gate of the first transistor; and wherein the non-inverted output terminal of a previous stage is connected to gates of the fourth and fifth transistors of a later stage, and the inverted output terminal of the previous stage is connected to gates of the second and sixth transistors of the later stage; gates of the fourth and fifth transistors of an initial stage are connected to the circuit input terminal; an inverted signal of an input signal input to the circuit input terminal is supplied to gates of the second and sixth transistors; and one of the non-inverted output terminal and the inverted output terminal is connected to the circuit output terminal.

Preferably, the first conductivity type channel is an n-channel, and the second conductivity type channel is a p-channel.

Preferably, the fourth power source voltage is less than the second power source voltage.

According to a fifth aspect of the present invention, there is provided a level shift circuit comprising a circuit input terminal connected to an output of an input side circuit operating by a first power source voltage and a second power source voltage; a circuit output terminal connected to an output side circuit operating by a third power source voltage and a fourth power source voltage which are different from the voltage of the input side circuit; a first level shift stage having a first non-inverted output terminal, a first inverted output terminal, a first transistor of a first conductivity type channel connected between a voltage source of the first power source voltage and the first non-inverted output terminal, a second transistor of a second conductivity type channel connected between a voltage source of the third power source voltage and the first non-inverted output terminal, a third transistor of the second conductivity type channel connected between the voltage source of the third power source voltage and the first inverted output terminal, a fourth transistor of the first conductivity type channel connected between the voltage source of the first power source voltage and the first inverted output terminal, a fifth transistor of the first conductivity type channel connected between one of the voltage sources of the second power source voltage and the fourth power source voltage and the first non-inverted output terminal, and a sixth transistor of the first conductivity type channel connected between one of the voltage sources of the second power source voltage and the fourth power source voltage and the first inverted output terminal, and wherein a common connection point of the first non-inverted output terminal and the first, second, and fifth transistors is connected to a gate of the third transistor and a common connection point of the second inverted output terminal and the third, fourth, and sixth transistors is connected to a gate of the second transistor; and a second level shift stage having a second non-inverted output terminal, a second inverted output terminal, a seventh transistor of a first conductivity type channel connected between a voltage source of the fourth power source voltage and the second non-inverted output terminal, an eighth transistor of a second conductivity type channel connected between a voltage source of the second power source voltage and the second non-inverted output terminal, a ninth transistor of the first conductivity type channel connected between the voltage source of the fourth power source voltage and the second inverted output terminal, a 10th transistor of the second conductivity type channel connected between the voltage source of the second power source voltage and the first inverted output terminal, an 11th transistor of the second conductivity type channel connected between the voltage source of the third power source voltage and the second non-inverted output terminal, and a 12th transistor of the second conductivity type channel connected between the voltage source of the third power source voltage and the second inverted output terminal, and wherein a common connection point of the second non-inverted output terminal and the seventh, eighth, and fifth transistors is connected to a gate of the ninth transistor and a common connection point of the second inverted output terminal and the ninth, 10th, and 11th transistors is connected to a gate of the seventh transistor; and wherein the first non-inverted output terminal of the first level shift stage is connected to gates of the 10th and 11th transistors of the second level shift stage, the first inverted output terminal of the first level shift stage is connected to gates of the eighth and 12th transistors of the second level shift stage; gates of the fourth and fifth transistors of the first level shift stage is connected to the circuit input terminal; an inverted signal of an input signal input to the circuit input terminal is supplied to gates of the first and sixth transistors; and one of the second non-inverted output terminal and the second inverted output terminal of the second level shift stage is connected to the circuit output terminal.

Preferably, the first conductivity type channel is an n-channel, and the second conductivity type channel is a p-channel.

According to a sixth aspect of the present invention, there is provided a level shift circuit, comprising a circuit input terminal connected to an output of an input side circuit operating by a first power source voltage and a second power source voltage; a circuit output terminal connected to an output side circuit operating by a third power source voltage and a fourth power source voltage which are different from the voltage of the input side circuit; a first level shift stage having a first non-inverted output terminal, a first inverted output terminal, a first transistor of a first conductivity type channel connected between a voltage source of the fourth power source voltage and the first non-inverted output terminal, a second transistor of a second conductivity type channel connected between a voltage source of the second power source voltage and the first non-inverted output terminal, a third transistor of the first conductivity type channel connected between the voltage source of the fourth power source voltage and the first inverted output terminal, a fourth transistor of the second conductivity type channel connected between the voltage source of the second power source voltage and the first inverted output terminal, a fifth transistor of the second conductivity type channel connected between the voltage source of the third power source voltage and the first non-inverted output terminal, and a sixth transistor of the second conductivity type channel connected between the voltage source of the third power source voltage and the first inverted output terminal, and wherein a common connection point of the first non-inverted output terminal and the first, second, and fifth transistors is connected to a gate of the third transistor and a common connection point of the first inverted output terminal, the third, fourth, and sixth transistors is connected to a gate of the first transistor; and a second level shift stage having a second non-inverted output terminal, a second inverted output terminal, a seventh transistor of a first conductivity type channel connected between a voltage source of the first power source voltage and the second non-inverted output terminal, an eighth transistor of a second conductivity type channel connected between a voltage source of the third power source voltage and the second non-inverted output terminal, a ninth transistor of the second conductivity type channel connected between the voltage source of the third power source voltage and the second inverted output terminal, a 10th transistor of the first conductivity type channel connected between the voltage source of the first power source voltage and the second inverted output terminal, an 11th transistor of the first conductivity type channel connected between one of the voltage sources of the second power source voltage and the fourth power source voltage and the second non-inverted output terminal, and a 12th transistor of the first conductivity type channel connected between the voltage sources of the second power source voltage and the fourth power source voltage and the second inverted output terminal, and wherein a common connection point of the second non-inverted output terminal and the seventh, eighth, and 11th transistors is connected to a gate of the ninth transistor and a common connection point of the second inverted output terminal, the ninth, 10th, and 12th transistors is connected to a gate of the eighth transistor; and the first non-inverted output terminal of the first level shift stage is connected to gates of the 10th and 11th transistors of the second level shift stage, and the first inverted output terminal of the first level shift stage is connected to gates of the seventh and 12th transistors of the second level shift stage; gates of the fourth and fifth transistors of a the first level shift stage are connected to the circuit input terminal; an inverted signal of an input signal input to the circuit input terminal is supplied to gates of the first and sixth transistors; and one of the second non-inverted output terminal and the second inverted output terminal of the second level shift stage is connected to the circuit output terminal.

Preferably, the first conductivity type channel is an n-channel, and the second conductivity type channel is a p-channel.

According to the present invention, by switching of a logic level of, for example, an input signal, a logic state is switched from the state wherein a first and a sixth transistors are turned on and a second, a third, fourth, and fifth transistors are turned off (output is at H level at this time) to the state wherein the fourth and the fifth transistors are turned on and the first, second, third, and sixth transistors are turned off. At this time, the fifth transistor turns on, the potential at the gate of the fourth transistor falls and the third transistor transitionally turns on, consequently the potential at the drain (inverted output) of the fourth transistor rises.

At this time, since the potential at the gate rises, the second transistor functions to more reliably lower the output potential and the output becomes an L level. In this level shift circuit, by transitionally turning on the third transistor at the time that the fifth transistor is turned on, the potential at the gate of the second transistor rises faster and more strongly.

As a result, the level shift circuit is capable of operating at a high speed and being used as an interface in a circuit wherein a potential difference is large between the different potential circuits without the conversion delay in the level shift circuit.

Furthermore, since the transistors are connected in parallel (for example, parallel connection of first and second transistors) for improving the circuit performance (since this level shift circuit does not have a parallel configuration of more than three transistors), the circuit operates well at a low voltage. Also, due to the properties of the circuit, the above circuit performance does not deteriorate even if the size of transistors being used is reduced, therefore, although the number of transistors cannot be reduced, the circuit area can be reduced.

Note that at the time of transition of the output level from an L level to an H level, the first transistor is transitionally in an on-state to function in the same way as the above-mentioned third transistor.

Furthermore, for example, the first and the fourth transistors are connected to a power source supplying a first power source voltage which is lower than the third power source voltage, thus the present level shift circuit, when used as a booster circuit, does not consume the power on the boosted side and the boosting efficiency improves.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.
First Embodiment FIG. 1 is a circuit diagram of a first embodiment of a level shift circuit according to the present invention.

Figure 1:
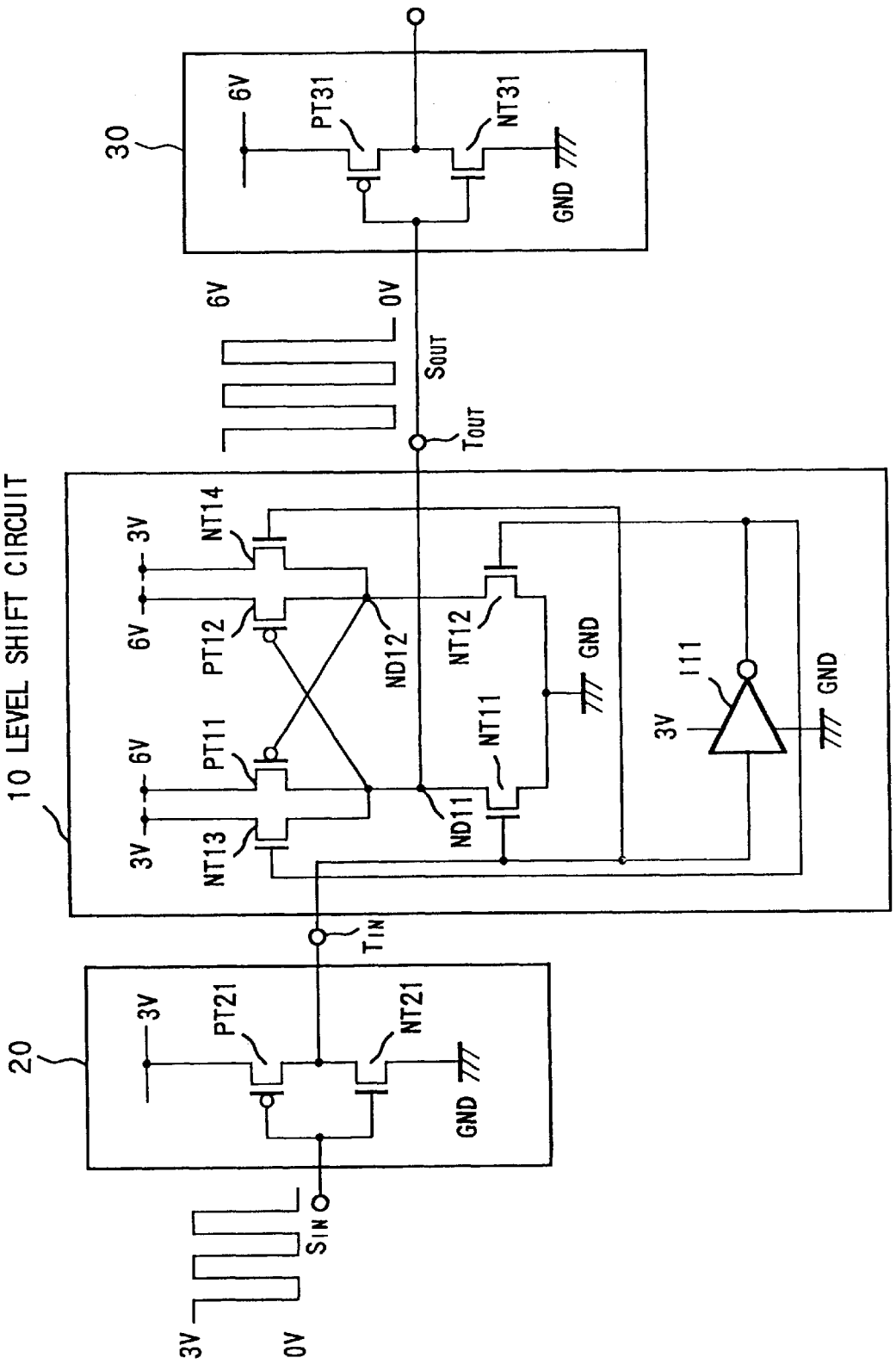
FIG. 1 is a circuit diagram of a first embodiment of a level shift circuit according to the present invention.

In FIG. 1, a level shift circuit 10 of the present intention is connected between a transmitting (input) side circuit 20 on a signal transmitting side and a receiving (output) side circuit 30 on a signal receiving side.

The level shift circuit 10 comprises an inverter I11 which operates by a first power source voltage (3V) of the transmitting side circuit 20 and a ground voltage as a second power source voltage, four NMOS transistors NT11 (fifth transistor), NT12 (sixth transistor), NT13 (first transistor), and NT14 (fourth transistor), and two PMOS transistors PT11 (second transistor) and PT12 (third transistor) which operates by a third power source voltage (6V) of the receiving side circuit 30 and a ground voltage as a fourth power source voltage.

An input terminal TIN of the level shift circuit 10 is connected to gates of the NMOS transistors NT11 and NT14 and an input of the inverter I11. An output of the inverter I11 is connected to gates of the NMOS transistors NT12 and NT13.

Drains of the NMOS transistors NT13 and NT14 are connected to a supply line of the first power source voltage of 3V and sources of the PMOS transistors PT11 and PT12 are connected to a supply line of the third power source voltage of 6V.

A source of the NMOS transistor NT11 is grounded and a drain thereof is connected to an output terminal TOUT, a source of the NMOS transistor NT13, a drain of the PMOS transistor PT11, and a gate of the PMOS transistor PT12. A connecting point of them forms a first node ND11.

A source of the NMOS transistor NT12 is grounded, and a drain thereof is connected to a source of the NMOS transistor NT14, a drain of the PMOS transistor PT12, and a gate of the PMOS transistor PT12. A connecting point of them forms a second node ND12.

The input (transmitting) side circuit 20 operates by the first power source voltage 3V and the second power source voltage (ground voltage) and is configured by connecting one PMOS transistor PT21 and one NMOS transistor NT21 in series between the 3V power source and the ground GND.

Gates of the PMOS transistor PT21 and the NMOS transistor NT21 are connected to an input terminal of a signal SIN. Also, a connecting point of drains of the two transistors is connected to the input terminal TIN of the level shift circuit 10.

The output (receiving) side circuit 30 operates by the third power source voltage 6V and the fourth power source voltage (ground voltage) and is configured by connecting one PMOS transistor PT31 and one NMOS transistor NT31 in series between the 6V voltage source and the ground GND.

In this level shift circuit 10, due to the circuit configuration, the gates of the PMOS transistors PT11 and PT12 are driven by the power source voltage of the output side circuit. Therefore, a feed through current does not flow in principle. Further, since the circuit has a two-stage configuration of transistors arranged lengthways (because there is no configuration having more than three transistors arranged lengthways), it operates well at a low voltage. Furthermore, while the number of transistors cannot be reduced in this configuration, the performance of the circuit does not deteriorate by reducing a size of the transistors used. As a result, the area of the circuit can be reduced.

Next, the operation of the level shift circuit 10 will be explained.

First, when a signal set to an H level (3V) is input from the transmitting side circuit 20, the NMOS transistors NT11 and NT14 become an on-state.

As a result of the NMOS transistor NT14 becoming the on-state, a potential at a gate of the PMOS transistor PT11 rises a little.

Also, since the NMOS transistor NTI1 is in an on-state, a potential at a gate of the PMOS transistor PT12 falls and a potential at a drain thereof rises.

At this time, the potential at the gate of the PMOS transistor PT11 rises further, thus it functions to lower the potential at the output terminal TOUT more reliably, and a signal SOUT set to an L level would be output at the output terminal TOUT.

Further, an input potential at the inverter I11 is high, so the output becomes 0V and the NMOS transistors NT13 and NT12 are held in an off-state.

Regarding the NMOS transistor NT14, along with the rise of the potential at source thereof (potential at gate of PMOS transistor PT11), a voltage between the gate and the source |Vgs| becomes smaller than the threshold voltage |Vth| and finally reaches the off-state.

Namely, the NMOS transistor NT14 is in an on-state transitionally at the time of switching of the logic level.

Here, due to the functions of the NMOS transistor NT14 which operates at the same time as the NMOS transistor NT11, the high speed operation is realized and the range of operating voltage can be expanded in this circuit.

Furthermore, the NMOS transistor NT14 can make the best use of the effect even if the size is reduced comparing with other transistors used here.

Next, when an L level (0V) signal is input from the input (transmitting) side circuit 20, the NMOS transistor NT11 becomes an off-state and the level is inverted at the inverter I11 so that the output potential becomes 3V.

Consequently, the NMOS transistors NT13 and NT12 become an off-state. As a result of the NMOS transistor NT13 transitionally turning on, the potential at the gate of the PMOS transistor PT12 rises a little.

Since the NMOS transistor NT12 is in the on-state, a potential at a gate of the PMOS transistor PT11 falls and a signal SOUT set to an H level (6V) is output at the output terminal TOUT.

At this time, because the potential at the gate rises, the PMOS transistor PT12 functions to lower the potential at the drain thereof (potential at gate of PMOS transistor PT11) more reliably.

In this case, the functions of the NMOS transistor PT13 enable this circuit to operate at a high speed and expand the range of operating voltage.

Furthermore, the NMOS transistor NT13 can perform effectively enough even if the size is reduced comparing with other transistors used here.

According to the level shift circuit 10, it is possible to realize a level shift circuit which, while reduced in circuit size thereof as much as possible, is capable of reducing the conversion delay while converting a signal level, operating at a high speed, expanding the range of operation voltage, and operating at a low voltage, wherein no feed-through current flows and low power consumption can be realized.

Further, since the drains of the NMOS transistors NT13 and NT14 are connected to the supply line of the first power source voltage, which is lower than the third power source voltage of 6V, when this level shift circuit is used for a booster circuit, it does not consume any power on the boosted side and the efficiency of voltage boosting can be improved.

Next, the level shift circuit according to the first embodiment will be explained giving an example of application to a DC-CD converter device.

Figure 2:
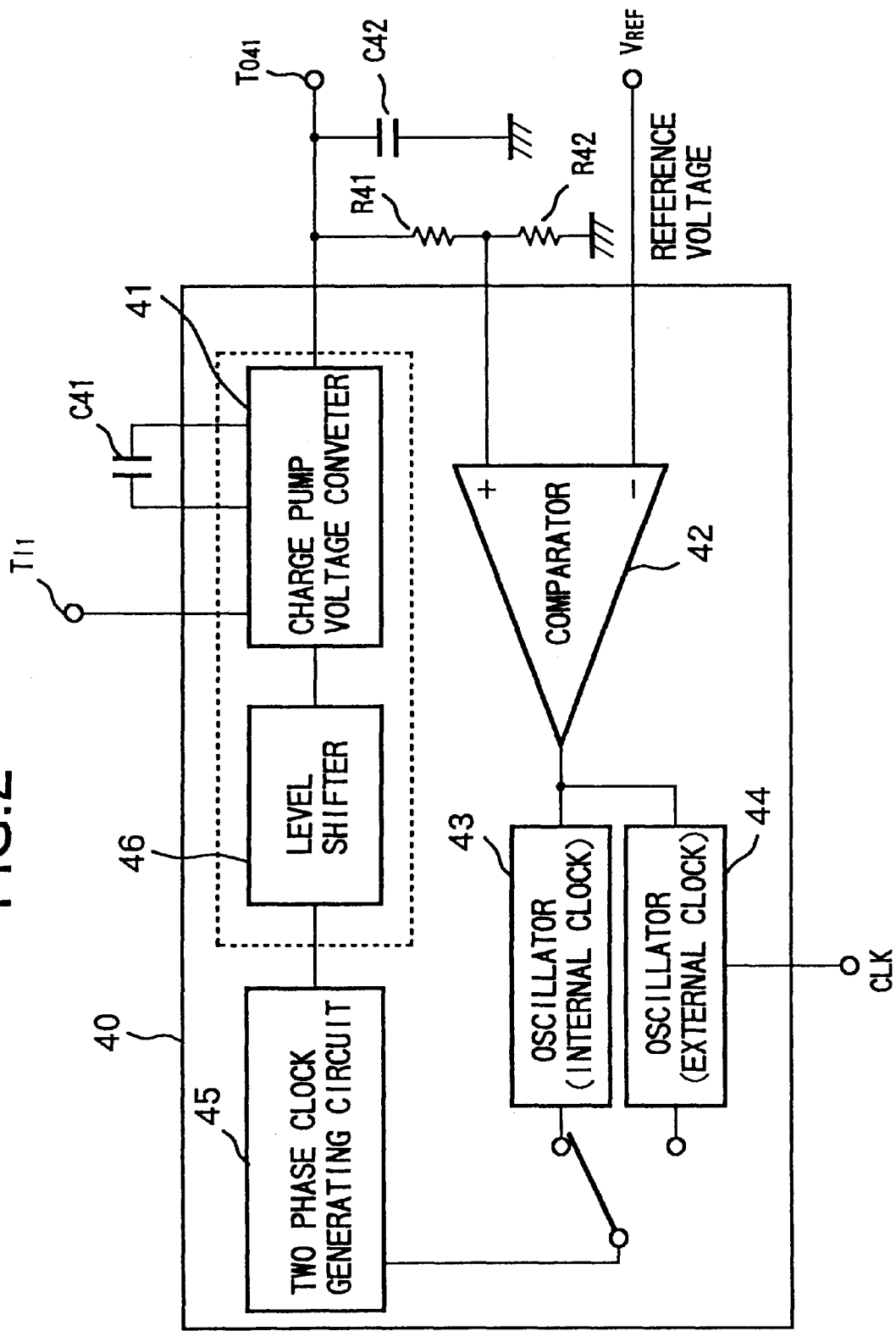
FIG. 2 is a block diagram of an example of a level shift circuit according to the present invention applied to a DC-CD converter device.

FIG. 2 is a circuit diagram of an example of application to a DC-CD converter device.

This DC-CD converter 40 comprises an input terminal TI41 and an output terminal TO41, receives a certain direct current (DC) voltage, converts it to another direct current voltage, and outputs the same.

This DC-CD converter 40 comprises a charge pump voltage converter 41 which actually carries out the voltage conversion, a comparator 42 for generating an error difference voltage for feedback, an oscillator 43 for generating an internal clock based on the error difference voltage from the comparator 42, an oscillator 44 for generating a clock based on the error difference voltage from the comparator 42 and external clock, a two-phase clock generating circuit 45 for generating clocks having different timings of the rising edge and trailing edge, and a level shifter 46 as an interface of different voltages.

The DC-CD converter circuit 40 comprises a pump capacitor C41 connected to the charge pump voltage converter 41, a capacitor C42 connected to the output terminal TO41, and two resistance elements R41 and R42 obtained by dividing the output voltage for supplying a non-inverted input (+) of the comparator 42 as an element mounted outside the DC-CD converter 40.

A reference voltage VREF is applied to an inverted input (−) of the comparator 42.

Here, a DC voltage of, for example, 3V is input to the input terminal TI41 to output a DC voltage of, for example, 6V to the output terminal TO41.

The level shifter 46 corresponds to the level shift circuit 10 in FIG. 1. The level shifter 46 and the charge pump converter 41 surrounded by the dotted line are a portion operating by the output voltage (6V), while the comparator 42, the oscillators 43 and 44, and the two-phase clock generating circuit 45 are a portion operating by the input voltage (3V) supplied from the input terminal TI41. Note that the level shifter 46 includes an inverter operating at 3V which generates an inverted signal by inverting the input signal input to the level shifter 46.

In the two-phase clock generating circuit 45, a clock having a high wave value of 3V is generated and is supplied to the portion operating at the power source voltage of 6V.

At this time, by supplying this clock via the level shifter 46 wherein no feed-through current flows, the current consumption in the level shifter 46 can be suppressed.

Furthermore, the level shifter 46 produces almost no clock delay due to conversion at the time of converting the level of the high wave value, so the respective timings of the rising edge and trailing edge of the clocks generated at the two-phase clock generating circuit 45 can be reliably maintained and supplied to the portion operating at the power source voltage of 6V. Accordingly, the operation of the charge pump voltage converter 41 can be accurately controlled.

As a result of the above reasons, it is possible to configure a DC-CD converter device highly efficient in voltage boosting.

Second Embodiment

Figure 3:
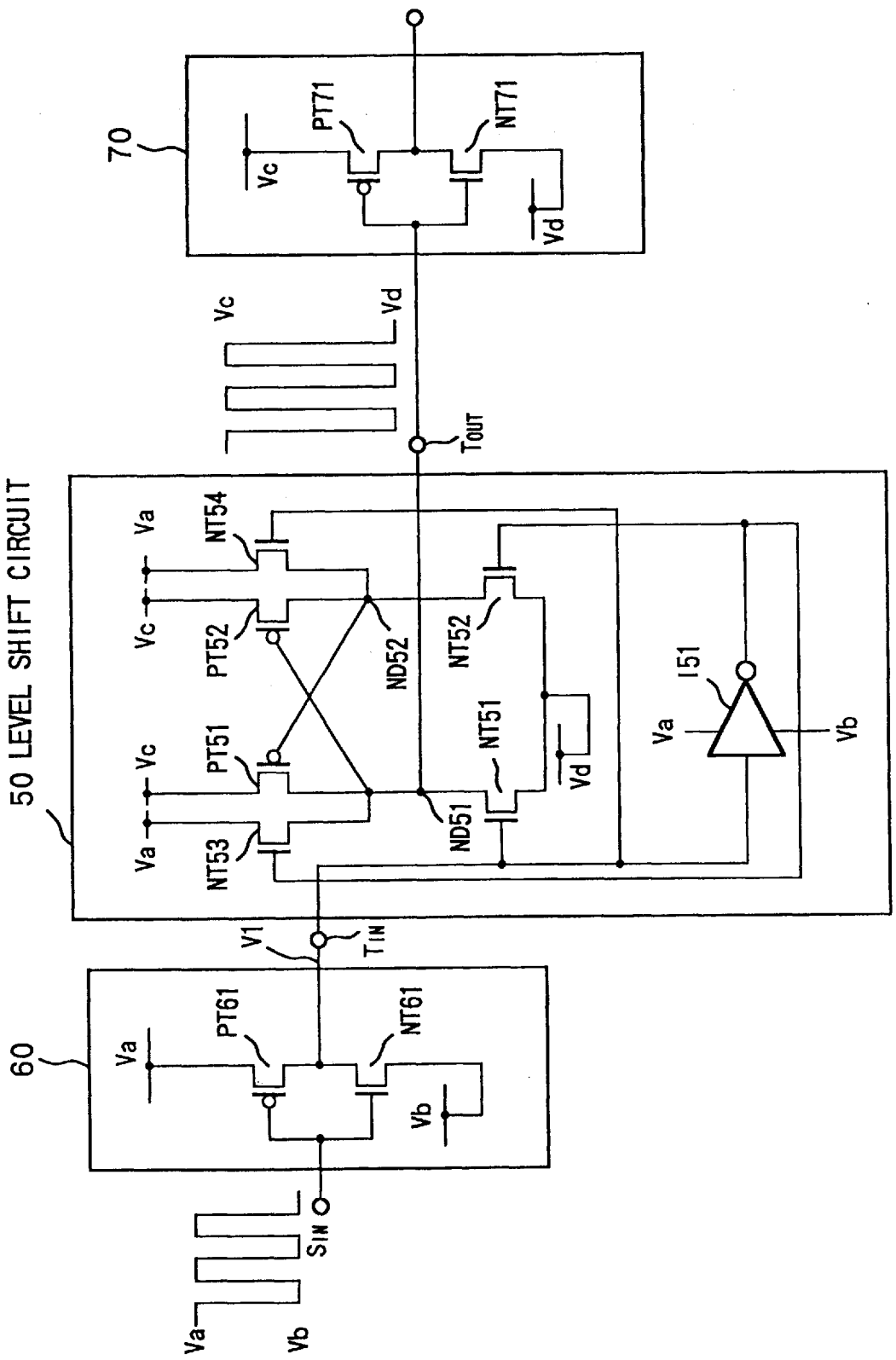
FIG. 3 is a block diagram of a second embodiment of a level shift circuit according to the present invention.

FIG. 3 is a circuit diagram of a second embodiment of a level shift circuit according to the present invention.

In a level shift circuit 50 according to the second embodiment, the potentials of logic levels, H and L, are different at an input side and an output side.

The level shift circuit 50 comprises an inverter I51 for inverting an input, an NMOS transistor NT53 (first transistor) and a PMOS transistor PT51 (second transistor) connected in parallel, an NMOS transistor NT54 (fourth transistor) and a PMOS transistor PT52 (third transistor) connected in parallel, an NMOS transistor NT51 (fifth transistor) and an NMOS transistor NT52 (sixth transistor) respectively connected in series with the respective above transistors connected in parallel.

An input terminal TIN of the level shift circuit 50 is connected to gates of the NMOS transistors NT51 and NT54 and an input of the inverter I51. An output of the inverter I51 is connected to gates of the NMOS transistors NT52 and NT53.

Drains of the NMOS transistors NT53 and NT54 are connected to a supply line of a first power source voltage Va, and sources of the PMOS transistors PT51 and PT52 are connected to a supply line of a third power source voltage Vc.

A source of the NMOS transistor NT51 is connected to a supply line of a fourth power source voltage Vd, and a drain thereof is connected to the output terminal TOUT, a source of the NMOS transistor NT53, a drain of the PMOS transistor PT51, and a gate of the PMOS transistor PT52. A connecting point of them forms a first node ND51.

A source of the NMOS transistor NT52 is connected to the supply line of the fourth power source voltage Vd, and a drain thereof is connected to a source of the NMOS transistor NT54, a drain of the PMOS transistor PT52, and a gate of the PMOS transistor PT52. A connecting point of them forms a second node ND52.

An input side circuit 60 of this level shift circuit 50 operates by the first power source voltage Va and the second power source voltage Vb (Va>Vb) and is configured by connecting one PMOS transistor NT61 and one NMOS transistor NT61 in series between the supply line of the first power source voltage Va and the supply line of the second power source voltage Vb.

Gates of the PMOS transistor PT61 and the NMOS transistor NT61 are connected to an input terminal of a signal SIN. The connecting point of the drains of the two transistors is connected to an input terminal TIN of the level shift circuit 50.

An output side circuit 70 operates by the third power source voltage Vc and the fourth power source voltage Vd (Vc>Vd, Vd≧Vb, Vc≧Va) and is configured by connecting one PMOS transistor PT71 and one NMOS transistor NT71 in series between the supply line of the power source voltage Vc and the supply line of the power source voltage Vd.

As explained above, the input side circuit 60 in the second embodiment is operated by the first and the second power source voltages Va and Vb (Va>Vb).

Accordingly, the H level of a signal supplied to the level shift circuit 50 is Va and the L level is Vb.

The level shift circuit 50 and its output side circuit 70 operates by the third and the fourth power source voltages Vc and Vd (Vc>Vd, Vd≧Vb, Vc≧Va). Note that the inverter I51 in the level shift circuit 50 operates by the first and the second power source voltages Va and Vb. Accordingly, the H level of a signal supplied from the level shift circuit 50 is Vc and the L level is Vd.

In such a configuration, first, when the input of the input side circuit 60 is the H level (=Va), the output potential becomes the L level (=Vb). As a result, the output of the inverter I51 in the level shift circuit 50 becomes the H level (=Va) and the NMOS transistors NT53 and NT52 become the on-state.

Since the NMOS transistor NT53 becomes the on-state, the potential at the gate of the PMOS transistor PT52 rises a little.

Since the NMOS transistor NT52 is in the on-state, the potential at the gate of the PMOS transistor PT51 falls a little.

As a result, the potential at the drain of the PMOS transistor PT51 rises and an H level (=Vc) is output at the output terminal TOUT.

At this time, the potential at the gate of the PMOS transistor PT52 rises further, so that it functions to lower the potential at the drain (potential at the gate of PMOS transistor PT51) more reliably.

Along with the rise of the potential at the source (potential at the output terminal TOUT) of the NMOS transistor NT53, the voltage between the gate and the source |Vgs| becomes smaller than the threshold voltage |Vth| and eventually reaches the off-state.

Namely, the NMOS transistor NT53 is transitionally in an on-state at the timing of switching of the logic level.

Here, the NMOS transistor NT53 operating at the same time as the NMOS transistor NT52 functions to enable the high speed operation of this circuit and expand the operational voltage range.

Next, when the input of the input side circuit 60 is the L level (=Vb), the output potential V1 becomes the H level= Va). Due to this, the NMOS transistors NT51 and NT54 become an on-state in the level shift circuit 50.

Since the NMOS transistor NT54 becomes an on-state, the potential at the gate of the PMOS transistor PT51 rises a little.

When the NMOS transistor NT51 is in an on-state, the potential at the gate of the PMOS transistor PT52 falls and the potential at the gate rises.

At this time, the potential at the gate of the PMOS transistor PT51 rises further, so the potential at the drain (potential at gate of PMOS transistor PT52) falls, which results in lowering the output of the level shift circuit 50 more reliably and an L level signal (=Vd) output from this level shift circuit 50.

Also, since the input of the inverter I51 is at an H level (=Va), the output becomes an L level (=Vb) and the NMOS transistor NT52 is in an off-state.

Along with the rise of the potential at the source of the NMOS transistor NT54 (potential at gate of PMOS transistor PT51), the voltage between the source and the gate |Vgs| becomes smaller than the threshold voltage |Vth| and finally becomes an off-state.

Namely, the NMOS transistor NT51 is transitionally in the on-state at the time of switching of the logic level.

Here, the NMOS transistor NT54 operating at the same time as the NMOS transistor NT51 functions to enable the high speed operation of this circuit and expand the range of the operational voltage.

Note that when manufacturing this level shift circuit 50 on an integrated circuit, it is also possible to connect a potential of the substrates of the transistors used here to the respective sources.

Further, as a power source voltage of the output side circuit 70, a case of Vc≧Va was explained above, however, the invention is not limited to such a case and can be used in a circuit having a relationship Vc≦Va.

Furthermore, it is also possible to use the common connecting point (inverted output) of the NMOS transistors NT54 and NT52 with the PMOS transistors PT52 as an output of the level shift circuit 50.

Also, since the drains of the NMOS transistors NT53 and NT54 are connected to the supply line of the first power source voltage of 3V, which is lower than the third power source voltage of 6V, when the level shift circuit is used in a booster circuit, it does not consume the power on the voltage-boosted side and the efficiency of boosting voltages can be improved.

Third Embodiment

Figure 4:
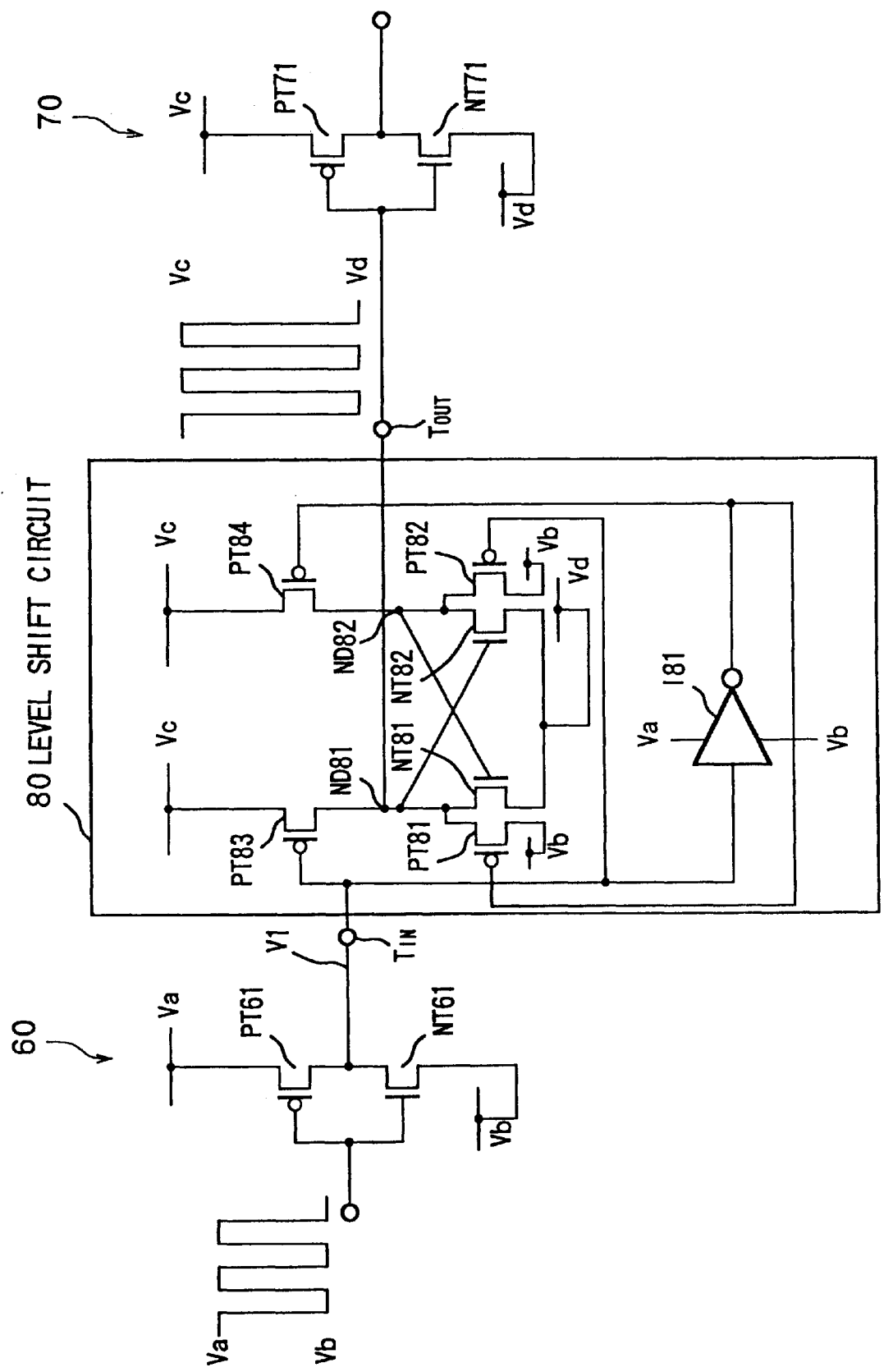
FIG. 4 is a circuit diagram of a third embodiment of a level shift circuit according to the present invention.

FIG. 4 is a circuit diagram of a third embodiment of the level shift circuit according to the present invention.

This example of the configuration of the level shift circuit 80 shows a case when driving a logic circuit which operates with a large voltage on the negative side.

The level shift circuit 80 comprises an inverter I81 for inverting an input, an NMOS transistor NT81 (first transistor), a PMOS transistor PT81 (second transistor) connected in parallel, an NMOS transistor NT82 (third transistor), and a PMOS transistor PT82 (fourth transistor) connected in parallel, a PMOS transistor PT83 (fifth transistor), and a PMOS transistor PT84 (sixth transistor) respectively connected in series with the above transistors connected in parallel.

An input terminal TIN of the level shift circuit 80 is connected to the gates of the PMOS transistors PT82 and PT83 and an input of the inverter I81. An output of the inverter I81 is connected to gates of the PMOS transistor PT81 and PT84.

Sources of the NMOS transistors NT81 and NT82 are connected to the supply line of the fourth power source voltage Vd. while the drains of the PMOS transistors PT81 and PT82 are connected to the supply line of the second power source voltage Vb.

A source of the PMOS transistor PT83 is connected to the supply line of the third power source voltage Vc, while a drain thereof is connected to the output terminal TOUT, a drain of the NMOS transistor NT81, a source of the PMOS transistor PT81, and a gate of the NMOS transistor NT82. A connection point of them configures a first node ND81.

A source of the PMOS transistor PT84 is connected to the supply line of the third power source voltage Vc, while the drain is connected to a drain of the NMOS transistor NT82, a source of the PMOS transistor PT82, and a gate of the NMOS transistor NT81. A connection point thereof configures a second node ND82.

An input side circuit 60 and the output side circuit 70 of this level shift circuit 80 have the same structure as that in FIG. 3.

Accordingly, the input side circuit 60 is operated by the first and second power source voltages Va and Vb (Va>Vb), while the level shift circuit 80 and the output side circuit 80 are operated by the second, third, and fourth power source voltages Vb, Vc, and Vd (Vc>Vd, Va≧Vc, and Vb≧Vd). Note that the inverter I81 in the level shift circuit 80 is operated by the first and second power source voltages Va and Vb.

As explained above, in the case of driving an output circuit which operates by a large voltage (=Vd) to the negative side, the PMOS transistors PT82 and PT83 become an on-state when the input voltage V1 to the level shift circuit 80 is an L level (=Vb).

As a result of the PMOS transistor PT82 becoming an on-state, the potential at the gate of the NMOS transistor NT81 falls a little.

Further, since the PMOS transistor PT83 is in the on-state, the potential at the drain of the PMOS transistor PT83 rises and an H level signal (=Vc) is output from the level shift circuit 80.

At this time, the potential at the gate of the NMOS transistor NT82 further rises, thus it functions to lower the potential at the drain (potential at gate of NMOS transistor NT81) more reliably. Also, since the input level of the inverter I81 is the L level (=Vb), the H level (=Va) signal is output from the inverter I81 and the PMOS transistors PT81 and PT84 are in an off-state.

Along with the fall of the potential at the source of the PMOS transistor PT82 (potential at gate of NMOS transistor NT81), the voltage between the gate and the source |Vgs| becomes smaller than the threshold voltage |Vth| and finally becomes an off-state.

Namely, the PMOS transistor PT82 is transitionally in an on-state at the time of switching of the logic level.

Here, the PMOS transistor PT82 which operates at the same time with the PMOS transistor PT83 functions to enable the high speed operation of this circuit and expand the range of the operational voltage.

When the input voltage V1 is an H level (=Va), an L level signal is output from the level shift circuit 80 in the same circuit operation.

Namely, when the input voltage V1 to the level shift circuit 80 is the H level (=Va), the output from the inverter I81 becomes the L level (=Vb), and the PMOS transistors PT81 and PT84 become the on-state.

Due to the PMOS transistor PT81 becoming the on-state, the potential at the gate of the NMOS transistor NT82 falls a little.

Further, since the PMOS transistor PT84 is in the on-state, the potential at the drain of the PMOS transistor PT84 rises, the NMOS transistor NT81 becomes an on-state, and an L level signal (=Vd) is output from the level shift circuit 80.

At this time, the potential at the gate of the NMOS transistor falls further, so that it functions to lower the potential at the drain (potential at gate of NMOS transistor NT81) all the more reliably.

At this time, the PMOS transistor PT81 which operates at the same time as the PMOS transistor PT84 functions to enable this circuit to operate at a high speed and expand the range of the operational voltage.

Note that in the case of manufacturing this level shift circuit 80 on an integrated circuit, it is possible to connect a potential of substrates of the transistors used here to respective sources. Also, as a power source voltage of the output side circuit, a case with Vb≧Vd was explained above, but the invention is not limited to this case and can be used in a circuit having a relationship Vb≦Vd. Further, it is also possible to use a common connection point (inverted output) of the PMOS transistors PT82 and PT84 with the NMOS transistor NT82 as an output of the level shift circuit 80.

Fourth Embodiment

Figure 5:
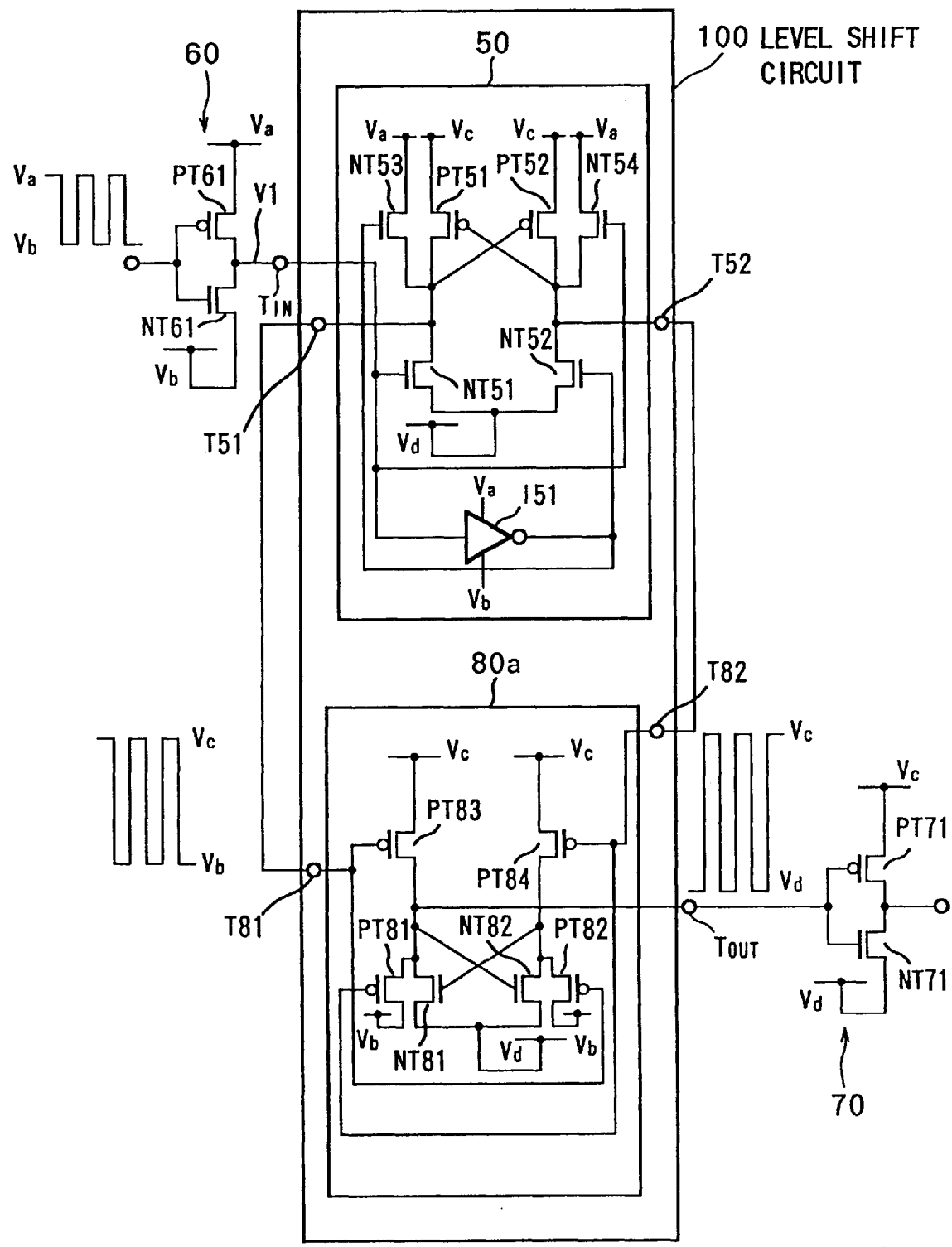
FIG. 5 is a circuit diagram of a fourth embodiment of a level shift circuit according to the present invention.
Figure 6:
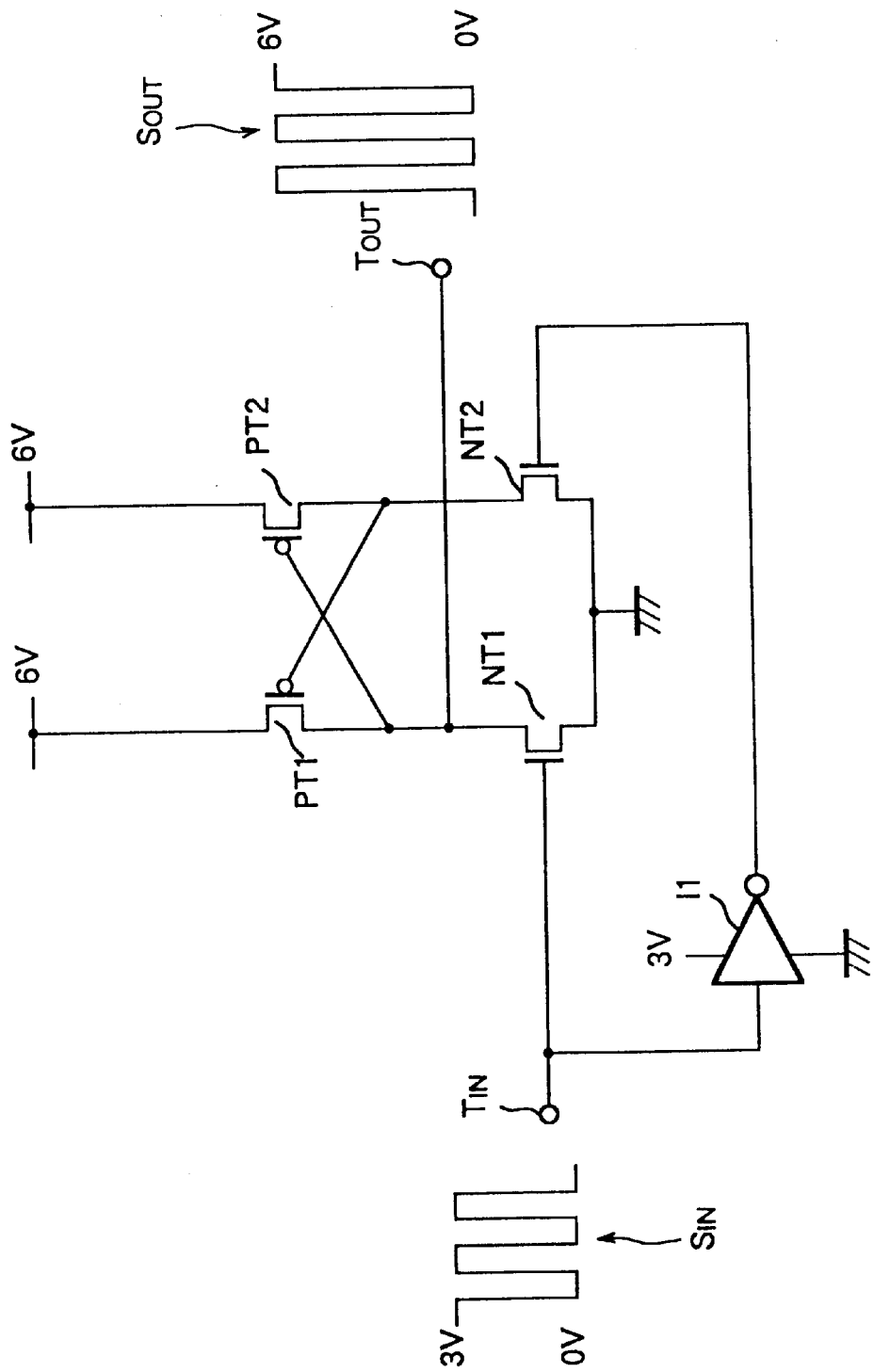
FIG. 6 is a circuit diagram of an example of the level shift circuit of the related art.
Figure 7:
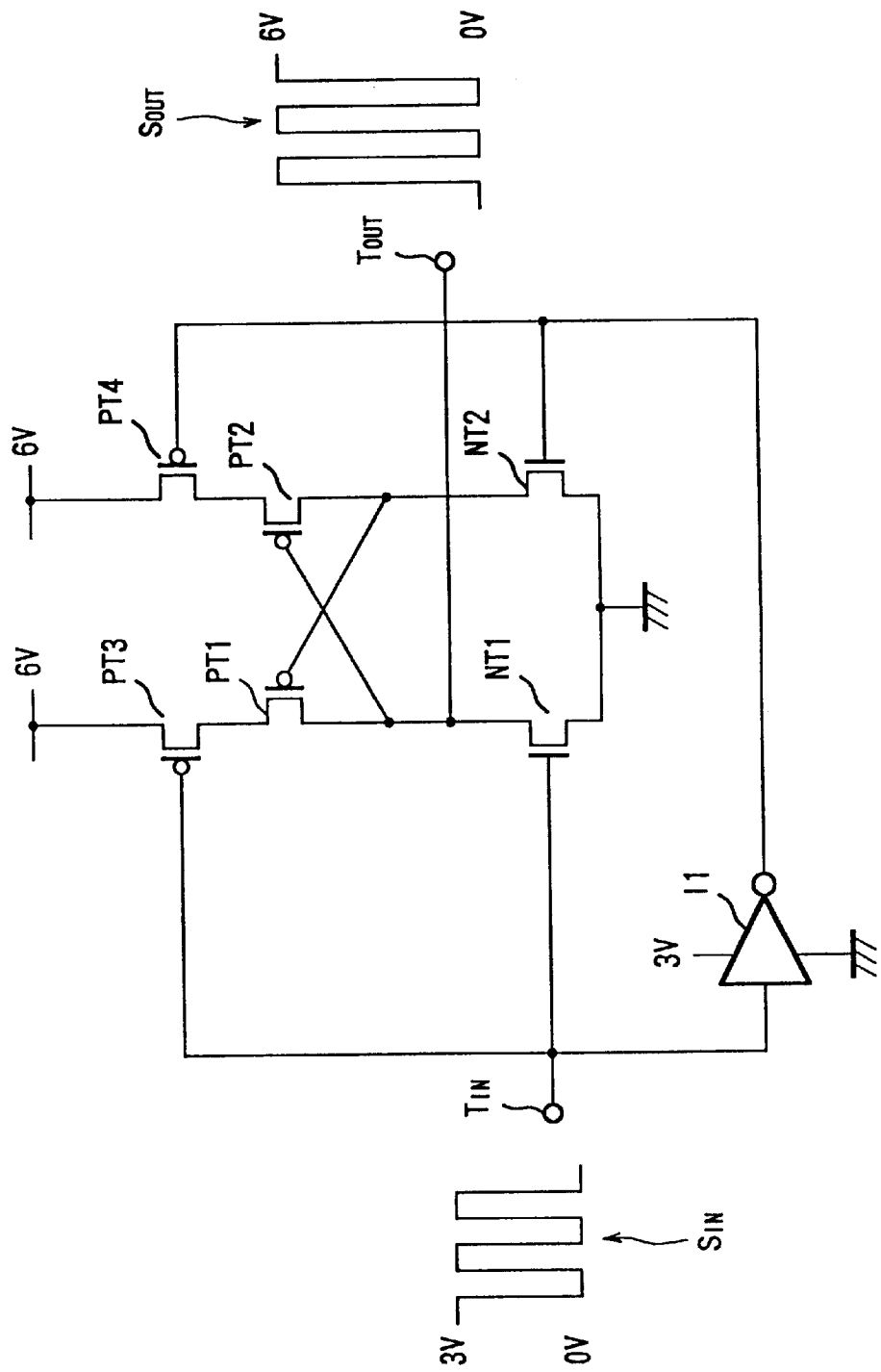
FIG. 7 is a circuit diagram of another example of the level shift circuit of the related art.

FIG. 5 is a circuit diagram of a fourth embodiment of a level shift circuit according to the present invention.

A level shift circuit 100 of FIG. 5 is configured by combining the level shift circuit 50 shown in FIG. 3 and the level shift circuit 80 shown in FIG. 4. This example of the configuration shows the case of driving a logic circuit which operates with a large voltage on both the positive and negative sides.

The level shift circuit 100 is configured with the input of the level shift stage 50 for driving a logic circuit operating with a large voltage on the positive side used as its input terminal TIN, with a non-inverted output terminal T51 and an inverted output terminal T52 of the level shift stage 50 respectively connected to a non-inverted input terminal T81 and an inverted input terminal T82 of a level shift stage 80a for driving a logic circuit operating with a large voltage on the negative side, and with the output of the level shift stage 80a used as an output terminal of this level shift circuit 100.

Note that the level shift stage 80a used in the level shift circuit 100 receives the inverted output from the previous output, so an inverter I81 is not provided.

An input side circuit 60 and an output circuit 70 have the same configuration as the circuits in FIG. 5 and FIG. 4.

Accordingly, the input side circuit 60 is operated by the first and second power source voltages Va and Vb (Va>Vb), and the output side circuit 70 is operated by the third and fourth power source voltages Vc and Vd (Vc>Vd, Vc≧Va and Vb≧Vd).

The level shift stage 50 in the level shift circuit 100 is operated by the first, third, and fourth power source voltages Va, Vc, and Vd and the level shift stage 80a is operated by the second, third, and fourth power source voltages Vb, Vc, and Vd. Note that the inverter I51 in the level shift stage 50 is operated by the first and second power source voltages Va and Vb.

According to such a configuration, when the input voltage V1 at an H level (=Va) is input to the level shift stage 50, first, in the same way as the circuit operation of the level shift stage 50 explained in FIG. 3, an L level (=Vd) signal is output at the output terminal T51 and input to the non-inverted input terminal T81 in the level shift stage 80a.

Namely, when the input voltage V1 at an H level (=Va) is input, the output of the inverter I51 in the level shift stage 50 becomes the L level (=Vb), and the NMOS transistors NT51 and NT54 become an on-state.

As a result of the NMOS transistor NT54 becoming the on-state, the potential at the gate of the PMOS transistor PT51 rises a little.

Since the NMOS transistor NT51 is in the on-state, the potential at the gate of the PMOS transistor PT51 falls and the potential at the drain rises.

At this time, the potential at the gate of the PMOS transistor PT51 rises all the more, so that the potential at the drain (potential at gate of PMOS transistor PT52) falls and functions to lower the output of the level shift stage 50 more reliably. Further, an L level signal (=Vd) is output from the output terminal T51 of this level shift stage 50 to the input terminal T81 of the level shift stage 80a as the next stage.

Further, an H level signal (=Vc) is output at the inverted output terminal T52 and input to the inverted input terminal T82 of the level shift stage 80a.

Then, an H level signal (=Vc) is output at the output terminal TOUT from the level shift stage 80a in the same way as the circuit operation explained in FIG. 4.

Namely, since an L level signal (=Vd) is input to the non-inverted input terminal T81 and an H level signal (=Vc) is input to the inverted input terminal T82, the PMOS transistors PT83 and PT82 become the on-state and the PMOS transistors PT81 and PT84 become the off-state.

When the PMOS transistor PT82 become the on-state, the potential at the gate of the NMOS transistor NT81 falls a little.

Further, since the PMOS transistor PT83 is in an on-state, the potential at the drain of the PMOS transistor PT83 rises, and an H level signal (=Vc) is output from the circuit output terminal TOUT of the level shift stage 80a.

When the input voltage V1 at an L level (=Vb) is input to the level shift stage 50, first, an H level signal (=Vc) is output at the non-inverted output terminal T51 in the same way as the circuit operation of the level shift circuit 50 explained in FIG. 3 and input to the non-inverted input terminal T81 of the level shift stage 80a, while an L level signal (=Vd) is output at the inverted output terminal T52 and input to the inverted input terminal T82.

Namely, in the level shift stage 50, the output of the inverter I51 becomes the H level (=Va) and the NMOS transistors NT53 and NT52 become the on-state.

Since the NMOS transistor NT53 is turned on, the potential at the gate of the PMOS transistor rises a little.

Since the NMOS transistor NT52 is in an on-state, the potential at the gate of the PMOS transistor PT51 falls.

Due to this, the potential at the drain of the PMOS transistor PT51 rises and an H level (=Vc) signal is output from the non-inverted output terminal T51 to the non-inverted input terminal T81 of the level shift stage 80a of the next stage.

Also, an L level signal (=Vd) is output at the inverted output terminal T52 and input to the inverted input terminal T82 of the level shift stage 80a.

In the same way as the circuit operation explained in FIG. 4, an L level signal (=Vd) is output at the output terminal TOUT from the level shift stage 80a.

Namely, since an H level signal (=Vc) is input to the non-inverted input terminal T81 and an L level signal (=Vd) is input to the inverted input terminal T82, the PMOS transistors PT81 and PT84 become the on-state and the PMOS transistors PT82 and PT83 become the off-state.

Since the PMOS transistor PT81 becomes the on-state, the potential at the gate of the NMOS transistor NT82 falls a little.

Also, since the PMOS transistor PT84 is in an on-state, the drain of the PMOS transistor PT84 rises, the NMOS transistor NT81 is turned on, and an L level signal (=Vd) is output from the level shift stage 80a.

Note that when manufacturing this level shift circuit 100 on an integrated circuit, it is possible to connect the potential at the substrates of the transistors used here to respective sources.

Also, as a power source voltage on the output side circuit, a case of Vb≧Vd and Vc≧Va was explained above, however the invention is not limited to this case and can be used in a circuit having relationship Vb≦Vd or Vc≦Va.

Furthermore, the level shift circuit 100 can also be configured to have the input of the level shift stage 80a as an input of this circuit 100, respectively connect the output and the inverted output of the level shift stage 80a with the input and the inverted input of the level shift stage 50, and have the output of the level shift stage 50 as an output of this circuit 100.

In this case, the level shift stage 80a is configured with an inverter I81 provided in the same way as in the circuit in FIG. 4 and the level shift stage 50 is configured with the inverter I51 removed from the circuit in FIG. 3.

Also, a configuration wherein a plurality of the circuits in FIG. 1 are connected, a plurality of the circuits in FIG. 3 are connected, etc. are possible.

As explained above, according to the present invention, there is an advantage that it is possible to realize a level shift circuit having little conversion delay at the time of converting a level of an input signal, consuming low power because of a regular through current due to the operation principle, and having a wide range of operational voltage.

Also, when using an N-channel transistor for the first conductivity channel and a P-channel transistor for the second conductivity channel, the P-channel transistor and the N-channel transistor connected to each other for improvement of the circuit performance can be reduced in size without deterioration of the circuit performance. Therefore, when comparing with the circuits of the related art, though the number of transistors cannot be reduced, the circuit area can be reduced consequently.

Furthermore, since the basic configuration of the circuit is a series connection of two transistors arranged longitudinally, including parallel connection, it is far better at operating at a low voltage compared with level shift circuits having a basic configuration of a series connection of three transistors lengthwise.

Furthermore, because the first and fourth transistors are connected to the supply line of the first power source voltage, and the second and fourth transistors are connected to the supply line of the second power source voltage, the level shift circuit does not consume any power on the voltage boosted side when used in a voltage booster, so the efficiency of boosting voltage can be improved.

While the invention has been described with reference to specific embodiment chosen for purpose of illustration, it should be apparent that numerous modifications could be made thereto by those skilled in the art without departing from the basic concept and scope of the invention.

What is claimed is:

1. A level shift circuit, comprising:
    an input terminal connected to an input side circuit operating by a first power source voltage and a second power source voltage;
    an output terminal connected to an output side circuit operating by a third power source voltage and a fourth power source voltage which are different from the voltage of the input side circuit;
    a first node;
    a second node;
    a first transistor of a first conductivity type channel connected between a voltage source of the first power source voltage and the first node;
    a second transistor of a second conductivity type channel connected between a voltage source of the third power source voltage and the first node;

a third transistor of the second conductivity type channel connected between the voltage source of the third power source voltage and the second node;

a fourth transistor of the first conductivity type channel connected between the voltage source of the first power source voltage and the second node;

a fifth transistor of the first conductivity type channel connected between one of the voltage sources of the second power source voltage and the fourth power source voltage and the first node; and a sixth transistor of the first conductivity type channel connected between one of the voltage sources of the second power source voltage and the fourth power source voltage and the second node; and wherein the first node is connected to a gate of the third transistor, the second node is connected to a gate of the second transistor, and gates of the fourth and fifth transistors are connected to the input terminal;

an inverted signal of an input signal input to the input terminal is supplied to gates of the first and sixth transistors; and one of the first node and the second node is connected to the output terminal.

2. A level shift circuit as set forth in claim 1, wherein the first conductivity type channel is an n-channel, and the second conductivity type channel is a p-channel.

3. A level shift circuit as set forth in claim 1, wherein the first conductivity type channel is a p-channel, and the second conductivity type channel is an n-channel.

4. A level shift circuit as set forth in claim 1, wherein the third power source voltage is higher than the first power source voltage, and the second and fourth voltages are a ground voltage.

5. A level shift circuit as set forth in claim 2, wherein the third power source voltage is higher than the first power source voltage, and the second and fourth voltages are a ground voltage.

6. A level shift circuit as set forth in claim 1, wherein one of the terminals of each the fifth and sixth transistors is connected to the voltage source of the fourth power source voltage, and the third power source voltage is higher than the first power source voltage.

7. A level shift circuit as set forth in claim 2, wherein one of the terminals of the fifth and sixth transistors is connected to the voltage source of the fourth power source voltage, and the third power source voltage is higher than the first power source voltage.

8. A level shift circuit, comprising:
an input terminal connected to an input side circuit operating by a first power source voltage and a second power source voltage;

an output terminal connected to an output side circuit operating by a third power source voltage and a fourth power source voltage which are different from the voltage of the input side circuit;

a first node;
a second node;
a first transistor of a first conductivity type channel connected between a voltage source of the fourth power source voltage and the first node;

a second transistor of a second conductivity type channel connected between a voltage source of the second power source voltage and the first node;

a third transistor of the first conductivity type channel connected between the voltage source of the fourth power source voltage and the second node;

a fourth transistor of the second conductivity type channel connected between the voltage source of the second power source voltage and the second node;

a fifth transistor of the second conductivity type channel connected between the voltage source of the third power source voltage and the first node; and a sixth transistor of the second conductivity type channel connected between the voltage source of the third power source voltage and the second node; and wherein the first node is connected to a gate of the third transistor, the second node is connected to a gate of the first transistor, and gates of the fourth and fifth transistors are connected to the input terminal;

an inverted signal of an input signal input to the input terminal is supplied to gates of the second and sixth transistors; and one of the first node and the second node is connected to the output terminal.

9. A level shift circuit as set forth in claim 8, wherein the first conductivity type channel is an n-channel, and the second conductivity type channel is a p-channel.

10. A level shift circuit as set forth in claim 8, wherein the first conductivity type channel is a p-channel, and the second conductivity type channel is an n-channel.

11. A level shift circuit as set forth in claim 8, wherein the fourth power source voltage is less than the second power source voltage.

12. A level shift circuit as set forth in claim 9, wherein the fourth power source voltage is less than the second power source voltage.

13. A level shift circuit, comprising:
a circuit input terminal connected to an input side circuit operating by a first power source voltage and a second power source voltage;

a circuit output terminal connected to an output side circuit operating by a third power source voltage and a fourth power source voltage which are different from the voltage of the input side circuit;

a plurality of level shift stages, each having a non-inverted output terminal, an inverted output terminal, a first transistor of a first conductivity type channel connected between a voltage source of the first power source voltage and the non-inverted output terminal, a second transistor of a second conductivity type channel connected between a voltage source of the third power source voltage and the non-inverted output terminal, a third transistor of the second conductivity type channel connected between the voltage source of the third power source voltage and the inverted output terminal, a fourth transistor of the first conductivity type channel connected between the voltage source of the first power source voltage and the inverted output terminal, a fifth transistor of the first conductivity type channel connected between one of the voltage sources of the second power source voltage and the fourth power source voltage and the non-inverted output terminal, and a sixth transistor of the first conductivity type channel connected between one of the voltage sources of the second power source voltage and the fourth power source voltage and the inverted output terminal, and wherein a common connection point of the non-inverted output terminal; the first, second, and fifth transistors is connected to a gate of the third transistor and a common connection point of the inverted output terminal; the third, fourth, and sixth transistors is connected to a gate of the second transistor; and wherein the non-inverted output terminal of a previous stage is connected to gates of the fourth and fifth transistors of a later stage, the inverted output terminal of the previous stage is connected to gates of the first and sixth transistors of the later stage;

gates of the fourth and fifth transistors of a initial stage is connected to the circuit input terminal;

an inverted signal of an input signal input to the circuit input terminal is supplied to gates of the first and sixth transistors; and one of the non-inverted output terminal and the inverted output terminal is connected to the circuit output terminal.

14. A level shift circuit as set forth in claim 13, wherein the first conductivity type channel is an n-channel, and the second conductivity type channel is a p-channel.

15. A level shift circuit as set forth in claim 13, wherein the third power source voltage is higher than the first power source voltage.

16. A level shift circuit as set forth in claim 13, wherein one each of the terminals of the fifth and sixth transistors is respectively connected to the voltage source of the fourth power source voltage, and the third power source voltage is higher than the first power source voltage.

17. A level shift circuit, comprising:

a circuit input terminal connected to an input side circuit operating by a first power source voltage and a second power source voltage;

a circuit output terminal connected to an output side circuit operating by a third power source voltage and a fourth power source voltage which are different from the voltage of the input side circuit;

a plurality of level shift stages, each having a non-inverted output terminal, an inverted output terminal, a first transistor of a first conductivity type channel connected between a voltage source of the fourth power source voltage and the non-inverted output terminal, a second transistor of a second conductivity type channel connected between a voltage source of the second power source voltage and the non-inverted output terminal, a third transistor of the first conductivity type channel connected between the voltage source of the fourth power source voltage and the inverted output terminal, a fourth transistor of the second conductivity type channel connected between the voltage source of the second power source voltage and the inverted output terminal, a fifth transistor of the second conductivity type channel connected between the voltage source of the third power source voltage and the non-inverted output terminal, and a sixth transistor of the second conductivity type channel connected between the voltage source of the third power source voltage and the inverted output terminal, and wherein a common connection point of the non-inverted output terminal and the first, second, and fifth transistors is connected to a gate of the third transistor and a common connection point of the inverted output terminal, and the third, fourth, and sixth transistors is connected to a gate of the first transistor; and wherein the non-inverted output terminal of a previous stage is connected to gates of the fourth and fifth transistors of a later stage, and the inverted output terminal of the previous stage is connected to gates of the second and sixth transistors of the later stage;

gates of the fourth and fifth transistors of an initial stage are connected to the circuit input terminal;

an inverted signal of an input signal input to the circuit input terminal is supplied to gates of the second and sixth transistors; and one of the non-inverted output terminal and the inverted output terminal is connected to the circuit output terminal.

18. A level shift circuit as set forth in claim 17, wherein the first conductivity type channel is an n-channel, and the second conductivity type channel is a p-channel.

19. A level shift circuit as set forth in claim 17, wherein the fourth power source voltage is less than the second power source voltage.

20. A level shift circuit, comprising:

a circuit input terminal connected to an input side circuit operating by a first power source voltage and a second power source voltage;

a circuit output terminal connected to an output side circuit operating by a third power source voltage and a fourth power source voltage which are different from the voltage of the input side circuit;

a first level shift stage having a first non-inverted output terminal, a first inverted output terminal, a first transistor of a first conductivity type channel connected between a voltage source of the first power source voltage and the first non-inverted output terminal, a second transistor of a second conductivity type channel connected between a voltage source of the third power source voltage and the first non-inverted output terminal, a third transistor of the second conductivity type channel connected between the voltage source of the third power source voltage and the first inverted output terminal, a fourth transistor of the first conductivity type channel connected between the voltage source of the first power source voltage and the first inverted output terminal, a fifth transistor of the first conductivity type channel connected between one of the voltage sources of the second power source voltage and the fourth power source voltage and the first non-inverted output terminal, and a sixth transistor of the first conductivity type channel connected between one of the voltage sources of the second power source voltage and the fourth power source voltage and the first inverted output terminal, and wherein a common connection point of the first non-inverted output terminal and the first, second, and fifth transistors is connected to a gate of the third transistor and a common connection point of the second inverted output terminal and the third, fourth, and sixth transistors is connected to a gate of the second transistor; and a second level shift stage having a second non-inverted output terminal, a second inverted output terminal, a seventh transistor of a first conductivity type channel connected between a voltage source of the fourth power source voltage and the second non-inverted output terminal, an eighth transistor of a second conductivity type channel connected between a voltage source of the second power source voltage and the second non-inverted output terminal, a ninth transistor of the first conductivity type channel connected between the voltage source of the fourth power source voltage and the second inverted output terminal, a 10th transistor of the second conductivity type channel connected between the voltage source of the second power source voltage and the second inverted output terminal, an 11th transistor of the second conductivity type channel connected between the voltage source of the third power source voltage and the second non-inverted output terminal, and a 12th transistor of the second conductivity type channel connected between the voltage source of the third power source voltage and the second inverted output terminal, and wherein a common connection point of the second non-inverted output terminal and the seventh, eighth, and 11th transistors is connected to a gate of the ninth transistor and a common connection point of the second inverted output terminal and the ninth, 10th, and 11th transistors is connected to a gate of the seventh transistor; and wherein the first non-inverted output terminal of the first level shift stage is connected to gates of the 10th and 11th transistors of the second level shift stage, the first inverted output terminal of the first level shift stage is connected to gates of the eighth and 12th transistors of the second level shift stage;

gates of the fourth and fifth transistors of a the first level shift stage is connected to the circuit input terminal;

an inverted signal of an input signal input to the circuit input terminal is supplied to gates of the first and sixth transistors; and one of the second non-inverted output terminal and the second inverted output terminal of the second level shift stage is connected to the circuit output terminal.

21. A level shift circuit as set forth in claim 20, wherein the first conductivity type channel is an n-channel, and the second conductivity type channel is a p-channel.

22. A level shift circuit, comprising:

a circuit input terminal connected to an input side circuit operating by a first power source voltage and a second power source voltage;

a circuit output terminal connected to an output side circuit operating by a third power source voltage and a fourth power source voltage which are different from the voltage of the input side circuit;

a first level shift stage having a first non-inverted output terminal, a first inverted output terminal, a first transistor of a first conductivity type channel connected between a voltage source of the fourth power source voltage and the first non-inverted output terminal, a second transistor of a second conductivity type channel connected between a voltage source of the second power source voltage and the first non-inverted output terminal, a third transistor of the first conductivity type channel connected between the voltage source of the fourth power source voltage and the first inverted output terminal, a fourth transistor of the second conductivity type channel connected between the voltage source of the second power source voltage and the first inverted output terminal, a fifth transistor of the second conductivity type channel connected between the voltage source of the third power source voltage and the first non-inverted output terminal, and a sixth transistor of the second conductivity type channel connected between the voltage source of the third power source voltage and the first inverted output terminal, and wherein a common connection point of the first non-inverted output terminal and the first, second, and fifth transistors is connected to a gate of the third transistor and a common connection point of the first inverted output terminal, the third, fourth, and sixth transistors is connected to a gate of the first transistor; and a second level shift stage having a second non-inverted output terminal, a second inverted output terminal, a seventh transistor of a first conductivity type channel connected between a voltage source of the first power source voltage and the second non-inverted output terminal, an eighth transistor of a second conductivity type channel connected between a voltage source of the third power source voltage and the second non-inverted output terminal, a ninth transistor of the second conductivity type channel connected between the voltage source of the third power source voltage and the second inverted output terminal, a 10th transistor of the first conductivity type channel connected between the voltage source of the first power source voltage and the second inverted output terminal, an 11th transistor of the first conductivity type channel connected between one of the voltage sources of the second power source voltage and the fourth power source voltage and the second non-inverted output terminal, and a 12th transistor of the first conductivity type channel connected between the voltage sources of the second power source voltage and the fourth power source voltage and the second inverted output terminal, and wherein a common connection point of the second non-inverted output terminal and the seventh, eighth, and 11th transistors is connected to a gate of the ninth transistor and a common connection point of the second inverted output terminal, the ninth, 10th, and 12th transistors is connected to a gate of the eighth transistor; and wherein the first non-inverted output terminal of the first level shift stage is connected to gates of the 10th and 11th transistors of the second level shift stage, and the first inverted output terminal of the first level shift stage is connected to gates of the seventh and 12th transistors of the second level shift stage;

gates of the fourth and fifth transistors of a the first level shift stage are connected to the circuit input terminal;

an inverted signal of an input signal input to the circuit input terminal is supplied to gates of the first and sixth transistors; and one of the second non-inverted output terminal and the second inverted output terminal of the second level shift stage is connected to the circuit output terminal.

23. A level shift circuit as set forth in claim 22, wherein the first conductivity type channel is an n-channel, and the second conductivity type channel is a p-channel.

* * * * *